(12) United States Patent
Aaltonen

(10) Patent No.: US 10,323,957 B2
(45) Date of Patent: Jun. 18, 2019

(54) CIRCUITRY AND METHOD FOR GENERATING A DISCRETE-TIME HIGH VOLTAGE

(71) Applicant: MURATA MANUFACTURING CO., LTD., Nagaokakyo-shi, Kyoto (JP)

(72) Inventor: Lasse Aaltonen, Espoo (FI)

(73) Assignee: MURATA MANUFACTURING CO., LTD., Nagaokakyo-Shi, Kyoto (JP)

( * ) Notice: Subject to any disclaimer, the term of this patent is extended or adjusted under 35 U.S.C. 154(b) by 285 days.

(21) Appl. No.: 15/354,224

(22) Filed: Nov. 17, 2016

(65) Prior Publication Data

US 2017/0146364 A1 May 25, 2017

(30) Foreign Application Priority Data

Nov. 23, 2015 (FI) .................................... 20155865

(51) Int. Cl.
*G01R 27/26* (2006.01)
*G01C 25/00* (2006.01)
*B81C 99/00* (2010.01)
*G01C 19/5712* (2012.01)
*G01P 15/125* (2006.01)
*G01P 21/00* (2006.01)

(52) U.S. Cl.
CPC .......... *G01C 25/00* (2013.01); *B81C 99/0035* (2013.01); *G01C 19/5712* (2013.01); *G01P 15/125* (2013.01); *G01P 21/00* (2013.01)

(58) Field of Classification Search
USPC .......................... 324/660–663, 679, 681, 686
See application file for complete search history.

(56) References Cited

U.S. PATENT DOCUMENTS 6,918,282 B2 7/2005 Zarabadi
2008/0197861 A1 8/2008 Grosjean et al.
(Continued)

FOREIGN PATENT DOCUMENTS

EP 0 718 740 A2 6/1996
EP 0 718 977 A2 6/1996
(Continued)

OTHER PUBLICATIONS

Finnish Search Report dated Jun. 3, 2016 corresponding to Finnish Patent Application No. 20155865.
(Continued)

*Primary Examiner* — Vincent Q Nguyen
(74) *Attorney, Agent, or Firm* — Squire Patton Boggs (US) LLP

(57) ABSTRACT

A discrete-time high voltage generating circuitry is described, configured to provide a discrete-time high voltage at a high voltage output only during defined high voltage periods. The discrete-time high voltage generating circuitry includes a current mirror circuitry configured to receive a supply current from a high voltage source and to provide a slew current. The discrete-time high voltage generating circuitry is configured to generate the discrete-time high voltage using the slew current. Further, a method to operate a discrete-time high voltage generating circuitry is described. The circuitry and method may be used to provide a discrete-time self-test bias voltage to at least one capacitive load such as a capacitive MEMS element.

22 Claims, 7 Drawing Sheets

(56) References Cited

U.S. PATENT DOCUMENTS

| | | |
|---|---|---|
| 2012/0013351 A1 | 1/2012 | Daniel et al. |
| 2012/0153973 A1 | 6/2012 | Guo |
| 2015/0210071 A1* | 7/2015 | Van Brocklin ........ B41J 2/0452 347/10 |

FOREIGN PATENT DOCUMENTS

| | | |
|---|---|---|
| EP | 2 650 642 A2 | 10/2013 |
| WO | 2013/108499 A1 | 7/2013 |

OTHER PUBLICATIONS

European Search Report application No. EP 16 19 9720 dated Mar. 22, 2017.
Andrew Mason et al., "A Mixed-Voltage Sensor Readout Circuit with On-Chip Calibration and Built-In Self-Test", IEEE Swnsors Journal., vol. 7 , No. 9. Sep. 2007, pp. 1225-1232.
Lasse Aaltonen et al., "On-Chip Digitally Tunable High Voltage Generator for Electrostatic Control of Micromechanical Devices", IEEE pp. 2006 Custom Intergrated Circuits Conference (CICO), pp. 583-586.

* cited by examiner

CIRCUITRY AND METHOD FOR GENERATING A DISCRETE-TIME HIGH VOLTAGE

BACKGROUND

The present invention relates to self-testing of microelectromechanical (MEMS) sensor devices and especially to a discrete-time high voltage generating circuitry as defined in the independent claim 1. The present invention further relates to a method to operate a discrete-time high voltage generating circuitry as defined in the independent claim 13.

Micro-Electro-Mechanical Systems or MEMS can be defined as micro-scale mechanical and electro-mechanical systems where at least some elements have a mechanical functionality. MEMS structures can be applied to quickly and accurately detect very small changes in physical properties.

Capacitive microelectromechanical sensors have become part of many consumer devices and they are used also in a variety of safety critical applications, such as electronic stability control (ESC) in vehicles. Especially in the safety related applications, it is important to identify potential failures in mechanical or electrical signal paths of the capacitive sensor.

A capacitive sensor comprises at least one microelectromechanical element that comprises at least one capacitive element. The capacitive element comprises a rotor mass (a.k.a. proof mass or in short, just a rotor) and a stator which remains stationary while the rotor mass moves in response to acceleration. The position of the rotor mass in a reference system is measured by detecting signal capacitance. An electrode attached to or incorporated by the rotor mass and an electrode attached to or incorporated by the stator form a variable capacitor with a capacitance. When the rotor mass moves relative to the stator, a change in the distance between the electrodes is converted to a change in the capacitance of this variable capacitor. A single variable capacitor is created between a static electrode of the stator and a moving electrode of the rotor mass (rotor). The total capacitance of the single variable capacitor includes a static capacitance defined by the capacitor configuration and a signal capacitance that results from the motion of the rotor mass in response to external acceleration.

Built-in functionality diagnostics is a way to ensure that a device may identify its own erroneous operation rapidly. Recognizing erroneous operation or failure of the device is especially important for devices which are used for critical functionalities. An example of devices with such critical functionality is accelerometers in automotive components. A start-up self-test is run prior to normal operation and can be used to check at least the whole dynamic operating range of the sensor or even above the dynamic operating range of the sensor. The start-up self-test is thus capable of detecting for example faults which appear only above signal levels that are normally utilized but still within operating range.

DESCRIPTION OF THE RELATED ART

Number of methods are known in the art for generating a self-test signal for generating electrostatic forces. In a capacitive sensor, a self-test signal mimicking acceleration may be generated using electrostatic forces affecting on the rotor mass.

U.S. Pat. No. 6,918,282 discloses a self-test system where a DC deflection voltage is summed to the readout clock within nominal supply voltage. This considerably limits the attainable electrostatic force, and the self-test signal level receivable from the mechanical parts remains in low level compared to signals caused by full-scale acceleration. In order to mimic the full-scale acceleration induced motion of the micromechanical rotor mass, voltages higher than the nominal supply are needed.

Generation of high voltages locally is beneficial because the external high-voltage is usually not available, especially in field conditions. On-chip generation of variable high voltages is challenging and the locally generated high voltage possesses moderately high output impedance and low current capability. Known solutions providing sufficiently high current capability require significant chip area. In many existing self-test systems, a precise high voltage is needed. A switched-capacitor network is one known method to create a precise high voltage. It is, however, very demanding to create a switched-capacitor network to control the level of high-voltage signal, due to the fact that high-voltage must exist in order to create a high voltage signal, while switching related transient should not draw excessively current from high-impedance locally generated high voltage source. Oxide voltage tolerance can become a limiting factor, when a number of high voltage tolerant components are required to implement the high voltage generation circuitry.

Use of a charge pump is one alternative to generate high voltages locally for self-test purposes. "A Mixed-Voltage Sensor Readout Circuit With On-Chip Calibration and Built-In Self-Test" by A. Mason, A. V. Chavan and K. D. Wise on IEEE Sensors Journal, Vol 7, Issue 9, discloses a charge pump solution for generating a high voltage. The charge pump capacitors in this system are as large as 20 pF, in order to generate variable high voltages from 8V to 30V using a 5V supply voltage. The area of the charge pump circuitry is therefore considerably large.

Another known alternative for generating a high voltage is disclosed in "On-chip Digitally Tunable High Voltage Generator for Electrostatic Control of Micromechanical Devices" by L. Aaltonen, M. Saukoski and K. Halonen, presented in IEEE Custom Integrated Circuits Conference 2006. In this solution, a constant high-voltage generating charge pump or a boost controller is utilized that is used as a supply for high voltage amplifier, which scales a controllable low voltage reference signal into a precise high voltage signal. A purpose of this arrangement is to generate a precise high voltage reference. It is, however, area consuming to create a complete closed loop amplifier using a high voltage tolerant transistor together with large resistors for closed loop DC biasing. Furthermore, these large resistors consume part of the high voltage current and unnecessarily load the charge pump output. Operation speed of this type of setup is also limited due to the fact that also the high voltage current is limited. Long slew time easily introduces imprecision especially in discrete time interfaces if it is necessary to rely on precise RMS voltage.

SUMMARY

The following embodiments are exemplary. Although the specification may refer to "an", "one", or "some" embodiment(s), this does not necessarily mean that each such reference is to the same embodiment(s), or that the feature only applies to a single embodiment. Single features of different embodiments may be combined to provide further embodiments.

It is to be understood that the apparatus is configured to perform the corresponding method, although in some cases only the apparatus or only the method are described.

An object of the present invention is to provide a method and apparatus so as to overcome the prior art disadvantages. The objects of the present invention are achieved with an apparatus according to claim 1. The objects of the present invention are further achieved with a method according to claim 13.

The preferred embodiments of the invention are disclosed in the dependent claims.

According to a first aspect, a discrete-time high voltage generating circuitry is provided. The circuitry is configured to provide a discrete-time high voltage at a high voltage output only during defined high voltage periods. The discrete-time high voltage generating circuitry comprises a current mirror circuitry configured to receive a supply current from a high voltage source and to provide a slew current. The discrete-time high voltage generating circuitry is configured to generate the discrete-time high voltage using the slew current. The high voltage output is configured to be in zero current state during periods different than the defined high voltage periods.

According to a second aspect, the discrete-time high voltage generating circuitry comprises a high voltage control circuitry. This high voltage control circuitry comprises a voltage division network comprising two capacitors connected in series. The voltage division network is configured to receive part of the slew current, and a comparator configured to compare a voltage level between the two capacitors of the voltage division network to a pre-set reference voltage and, in response to the comparing, provide in its output a logical signal for controlling provision of the slew current.

According to a third aspect, the current mirror circuitry is configured to provide the slew current for generating the discrete-time high voltage during at least part of duration of the defined high voltage periods.

According to a fourth aspect, the discrete-time high voltage generating circuitry is configured to essentially maintain a generated high voltage value at the high voltage output when the current mirror circuitry is set to output a zero current during the defined high voltage periods.

According to a fifth aspect, two capacitors of the voltage division network are configured to essentially maintain the generated high voltage value during the defined high voltage periods after generation of the high voltage.

According to a sixth aspect, the high voltage control circuitry further comprises at least one reset switch configured to cause resetting voltages over the capacitors of the voltage division network to essentially zero voltage prior to enabling discrete-time high voltage generation and after disabling discrete-time high voltage generation.

According to a seventh aspect, a current mirror control transistor is configured to control a reference current from the high voltage source towards the current mirror circuitry. The current mirror circuitry is configured to be enabled by providing a logical high value at a gate of the current mirror control transistor.

According to an eighth aspect, the comparator is configured to provide a logical high value in its output during the defined high voltage periods when the voltage between the capacitors of the voltage division network is below the pre-set reference voltage.

According to a ninth aspect, the output of the comparator providing the logical signal is coupled to the gate of the current mirror control transistor.

According to a tenth aspect, the discrete-time high voltage generating circuitry further comprises at least one logic circuitry configured to receive in its inputs a channel selection signal and the logical signal from the comparator. Output of the logic circuitry is coupled to the gate of the current mirror control transistor and is configured to control operation of the current mirror control transistor. The logic circuitry is configured to provide a logical high value at its output when both the channel selection signal and the logical signal provided by the comparator have logical high values.

According to an eleventh aspect, the discrete-time high voltage generating circuitry further comprises at least one isolating switching stage configured to further isolate both the high voltage control circuitry and the high voltage output from the current mirror circuitry for periods different than the defined high voltage periods.

According to a twelfth aspect, part of the slew current, received in the at least one isolating switching stage from the current mirror circuitry when the current mirror circuitry is activated during defined high voltage periods, is further configured to cause a diode to generate a gate bias voltage configured to close isolating switches of the isolating switching stage, causing the isolating switching stage to couple the current mirror circuitry to the high voltage control circuitry and to the high voltage output.

According to a thirteenth aspect, the discrete-time high voltage generating circuitry is configured to cause a capacitive load circuitry coupled to the high voltage output during the defined high voltage period to be the charged into the high voltage value, and the capacitive load circuitry is configured to maintain the high voltage value during a reminder of the defined high voltage period when the current mirror circuitry is inactivated.

According to a fourteenth aspect, the discrete-time high voltage generating circuitry is configured to provide a discrete-time self-test bias voltage to at least one capacitive MEMS element.

According to a fifteenth aspect, the discrete-time high voltage generating circuitry comprises the high voltage control circuitry configured to be temporally shared for controlling generation of at least one discrete-time high voltages for biasing more than one capacitive MEMS elements. The temporal sharing is configured to be implemented with circuitry comprising more than one sets of circuitry, each of said more than one sets of circuitry comprising a current mirror circuitry and a logic circuitry. Each of said more than one sets of circuitry is configured to control generation of a discrete-time high voltage to one of the more than one capacitive MEMS elements during different defined high voltage periods.

According to a sixteenth aspect, each of said more than one sets of circuitry further comprises an isolating switching stage.

According to a seventeenth aspect, each of said more than one sets of circuitry is configured to be activated during different defined high voltage periods.

According to another aspect, the circuitry comprises the high voltage control circuitry configured to be temporally shared for controlling generation of discrete-time high voltages for biasing more than one capacitive MEMS elements, wherein the temporal sharing is configured to be implemented with circuitry comprising more than one sets of circuitry, each of said more than one sets of circuitry comprising a current mirror circuitry as disclosed above, and a logic circuitry as disclosed above, wherein each of said more than one sets of circuitry is configured to control generation of a discrete-time high voltage to one of the more than one capacitive MEMS elements during different defined high voltage periods.

According to another aspect, a method to operate a discrete-time high voltage generating circuitry is provided. The circuitry is configured to provide a discrete-time high voltage at a high voltage output only during defined high voltage periods. The method comprises receiving a supply current from a high voltage source by a current mirror circuitry, and providing a slew current from the at least one current mirror circuitry and generating the discrete-time high voltage using the slew current. The high voltage output is set in zero current state during periods different than the defined high voltage periods.

According to another aspect, the method comprises controlling generation of said discrete-time high voltage by a high voltage control circuitry. The controlling comprises receiving at least part of the slew current in a voltage division network comprising two capacitors connected in series, and comparing a voltage level between said two capacitors of the voltage division network to a preset reference voltage. In response to said comparing, a logical signal is provided for controlling said provision of the slew current.

According to another aspect, the method comprises providing the slew current from said at least one current mirror circuitry for generating the discrete-time high voltage during at least part of duration of said defined high voltage periods.

According to a further aspect, the method further comprises maintaining a generated high voltage value in the high voltage output when the current mirror circuitry is set to output a zero current during said defined high voltage periods.

According another aspect, the method comprises essentially maintaining the generated high voltage value in the voltage division network.

According to a yet further aspect, the method further comprises resetting voltages over capacitors of the voltage division network to essentially zero voltage prior to enabling discrete-time high voltage generation and after disabling discrete-time high voltage generation.

According to another aspect, the method comprises setting the high voltage output in zero current state during periods different than said defined high voltage periods.

According to a further aspect, the method further comprises controlling a reference current from the high voltage source towards the current mirror circuitry with a current mirror control transistor, wherein the current mirror circuitry is configured to be activated by providing a logical high value at a gate of the current mirror transistor.

According to another aspect, the method comprises setting said logical signal into a logical high value during said defined high voltage periods when the voltage between said capacitors of the voltage division network is below a preset reference voltage.

According to a further aspect, the method further comprises controlling said current mirror control transistor with the logical signal.

According to a yet further aspect, the method further comprises receiving in inputs of a logic circuitry a channel selection signal and the logical signal, providing a logical value at the output of the logic circuitry and controlling said current mirror control transistor with the logical value provided at the output of the logic circuitry, wherein the method comprises providing a logical high value at the output of the logic circuitry when both the channel selection signal and the logical signal are in logical high state.

According to another aspect, the method further comprises isolating, with an isolating switching arrangement, the current mirror circuitry from the high voltage control circuitry and from the high voltage output for periods different than said defined high voltage periods.

According to another aspect, the method comprises causing a gate bias voltage to be generated over a diode in the isolating switching arrangement by part of the slew current received from the current mirror circuitry, wherein said gate bias voltage over the diode is configured to close isolating switches of the switching stage when the current mirror circuitry is activated during the defined high voltage periods, causing the isolating switching stage to couple the current mirror circuitry to said high voltage control circuitry and to the high voltage output.

According to yet another aspect, the method comprises causing a capacitive load circuitry coupled to said high voltage output to be charged into the high voltage value during a defined high voltage period, and maintaining said high voltage value in the capacitive load circuitry during the defined high voltage period when the current mirror circuitry is inactivated.

According to a further aspect, the method is used to provide a discrete-time self-test bias voltage to at least one capacitive MEMS element.

According to another aspect, the method comprises temporally sharing said high voltage control circuitry for controlling generation of at least one discrete-time high voltage for providing discrete-time high voltage bias voltages to more than one capacitive MEMS elements, wherein said temporal sharing comprises using more than one sets of circuitries, each of said sets of circuitry comprising a current mirror circuitry operated as disclosed above and a logic circuitry operated as disclosed above, each one of said sets of circuitry configured to generate a discrete-time high voltage to the respective one of the more than one capacitive MEMS elements.

According to a yet further aspect, the method further comprising activating each of said more than one sets of circuitry during different defined high voltage periods.

High voltage (HV) in the high voltage output node (HV_OUT) and in the high voltage supply node (HV_SUP) is defined to be higher than a nominal supply voltage that is externally fed to the circuitry. For example the nominal supply voltage may value of 5V or below, for example 3.3V and the high voltage supply node (HV_SUP) may be in range of 25V, or any selected voltage between 20V and 30V. It also applies that the high voltage (HV) is higher than absolute maximum voltage tolerated across a gate oxide in any utilized MOS transistors.

The present invention is based on the idea of using discrete-time high voltages for exciting a proof-mass to move in the required full-scale range in specified time frame, and making sure that after the excitation is removed, the sensor returns to the condition prior to excitation with specified accuracy and speed. The movement of the rotor mass is measured by detecting when the deflection of the rotor mass reaches certain threshold values rather than deflecting the rotor mass by a very specific amount. This way the discrete-time high voltage does not need to have very high absolute precision, as long as the generated discrete-time high voltage is high enough to cause the wanted deflection of the rotor mass. However, though absolute precision is not an essential parameter, high relative precision of the high voltage is beneficial as it decreases the amount of total variation of tested parameters such as test time. Control logic may be utilized to detect amount of deflection of the rotor mass during self-test and to stop provision of the high voltage self-test bias.

An advantage of the present invention is that it provides an area efficient resistor-less discrete-time high voltage bias generating system with low oxide stress functionality: all transistor gate-source voltages in the circuitry are relatively low, and generation of these voltages is possible without complicated high voltage circuitry. The system can be used to supply a wide scale of high-voltages for self-test purposes when only a high impedance high voltage supply with low current capability is available. Another advantage of the invention is that a reliable self-test may be performed without requirement of a precise high voltage bias.

BRIEF DESCRIPTION OF THE DRAWINGS

In the following the invention will be described in greater detail, in connection with preferred embodiments, with reference to the attached drawings, in which.

DETAILED DESCRIPTION

As used in this application, the term "circuitry" refers to all of the following: (a) hardware-only circuit implementations, such as implementations in only analog and/or digital circuitry, wherein the circuitry may comprise discrete and/or integrated components, and (b) combinations of circuits and software (and/or firmware), such as (as applicable): (i) a combination of processor(s) or (ii) portions of processor(s)/software including digital signal processor(s), software, and memory(ies) that work together to cause an apparatus to perform various functions, and (c) circuits, such as a microprocessor(s) or a portion of a microprocessor(s), that require software or firmware for operation, even if the software or firmware is not physically present.

As used in this application, "a capacitive element" represents circuitry capable of capacitive detection of movement of a rotor mass in relation to one or more stationary stators. Capacitive element may comprise a single variable capacitor, but it may also comprise two or more capacitors used for detecting movement of same rotor mass. An example of a capacitive element is a capacitive half-bridge.

"Inertial channel" comprises electrical signal originating from one capacitive element, carrying information about the results of electrical detection of the capacitive element. Inertial channel may comprise a differential signal. The electrical signal in the inertial channel may be processed by circuitry i.e. in order to amplify, filter or convert the electrical signal into a different form (i.e. turn an analog signal into a digital signal or a digital signal into an analog signal). Multiple (at least two) inertial channels may be temporally multiplexed and/or demultiplexed. The inertial channel may also be called in short "channel", and a signal channel such as a readout channel carrying multiple inertial channels in time domain multiplexed form may be referred to as "multiplexed inertial channels".

"Inertial signal" refers to the electrical signal originating from a capacitive element carrying information about the movement of the rotor mass. The inertial signal forms part of the signal carried by the in the inertial channel.

Figure 1:
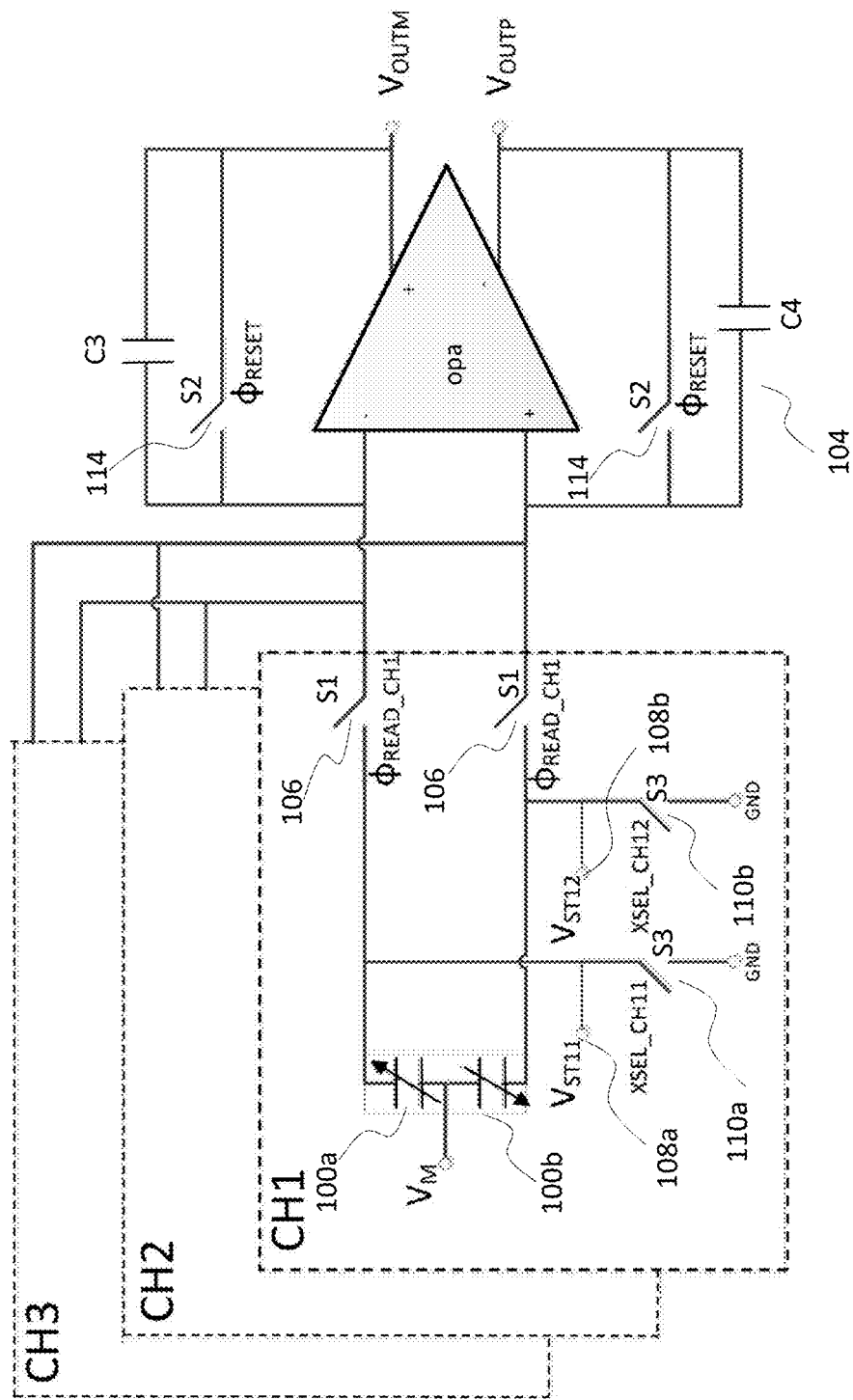
FIG. 1 is a schematic of a discrete-time capacitive MEMS sensor front-end.

FIG. 1 shows a simplified diagram illustrating basic elements necessary to describe embodiments of the present invention. It illustrates a first exemplary capacitive acceleration sensor with two variable capacitors (100a, 100b). The capacitors (100a, 100b) form a capacitive half-bridge where sensitivity of the first variable capacitor (100a) to the rotor mass position is opposite to the sensitivity of the second variable capacitor (100b) so that the capacitances of the capacitors change with opposite signs. Such capacitive half-bridge is one example of a capacitive element. The capacitance on one side of the capacitive half-bridge increases with acceleration, while the other side proportionally decreases. Also capacitive elements with more than two variable capacitors may be applied within the scope.

The capacitive sensor includes also a switched-capacitor readout circuitry (104) for detecting signal capacitances that result from motions of the variable capacitors (100a, 100b) forming a capacitive element. The switched-capacitor readout circuitry (104) may comprise an operation amplifier (opa), at least two capacitors (C3, C4).

In capacitive detection, it is necessary to establish a zero point measurement. For this, the switched capacitance circuit (104) needs to be reset between sampling periods. The capacitive sensor thus comprises a first switch arrangement S1 (106) adapted to electrically couple the readout circuitry (104) to the capacitive element for duration of a readout period ($\Phi_{READ\_CH1}$) of the specific inertial channel, and to electrically decouple the readout circuitry (104) from the one or more variable capacitors (100a, 100b) forming the capacitive element for partial duration of a reset period ($\Phi_{RESET}$) or for detection of another inertial channel.

The capacitive sensor may further comprise a second switch arrangement S2 (114), suitably synchronized to the first switch arrangement S1 (106) and adapted to reset the readout circuitry (104) between the readout periods ($\Phi_{RESET}$). This allows the inputs and outputs of the operational amplifier to settle before occurrence of a read pulse ($V_M$ transient). This eliminates or at least significantly reduces also effects of self-test bias voltage related transients from distorting the detected inertial signal. Synchronization between the reset ($\Phi_{RESET}$) and readout periods ($\Phi_{READ\_CH1}$) should not be understood strictly indicating exactly simultaneous switching, but the timings may be suitably arranged to achieve the intended functionality and to suppress transients.

FIG. 1 further illustrates an arrangement where more than one capacitive sensors representing more than one inertial channels share a common switched capacitance circuit (104). In this example, three inertial channels (CH1, CH2, CH3) can be seen, illustrated with dashed lines. The electrical switching circuitry arrangement for each of the inertial channels (CH1, CH2, CH3) may be essentially similar to the one illustrated for the first inertial channel (CH1), but with different selection of control signals for each channel.

In the present invention, the discrete-time nature of switched-capacitor detection is utilized to implement a voltage generating system to facilitate in-field self-test capability of the sensor device. The capacitive sensor includes self-test voltage input nets (108a, 108b) for coupling a self-test bias voltage to a respective stator of the capacitive element in order to cause electrostatic deflection of the rotor. In other words, an electrostatic force is caused to either of the variable capacitors (100a, 100b) by coupling a self-test bias voltage to a stator electrode of the capacitor. In the current example the two variable capacitors (100a, 100b) together form the capacitive element. Only one of the self-test voltage input nets (108a, 108b) is coupled to a self-test bias voltage at a time, while the other self-test voltage input net may be coupled to ground (zero voltage) together with rotor potential $V_M$ for maximizing the electrostatic force between the self-test biased stator and the rotor electrode. A third switching arrangement S3 (110a, 110b) may be configured to couple the self-test voltage input nets to ground according to two separate inverted channel selection control signals (XSEL_CH11, XSEL_CH12) when no self-test bias voltage is to be coupled towards the respective stator.

A discrete-time self-test bias voltage may be coupled to either of the self-test voltage input nets (108a, 108b) during reset periods ($\Phi_{RESET}$), so that the capacitive element is deflected in opposite directions. However, during consecutive periods the selected self-test voltage input net (108a, 108b) may be kept unchanged until the desired deflection magnitude is attained, after which the other one of the two self-test voltage input nets (108b, 108a) may be selected and periodically biased. The other self-test voltage input net (108a, 108b) is unselected by coupling it to ground using the respective third switch S3 (110a, 110b) controlled by the respective inverted channel selection control signal (XSEL_CH11, XSEL_CH12), when other self-test voltage input net is used for self-test biasing. In case of multiple inertial channels (CH1, CH2, CH3), just one of the self-test voltage input nets may be coupled to high voltage self-test bias at the time.

For self-test purposes, one of the self-test voltage input nets (108a, 108b) is used to couple a self-test bias voltage to the respective variable capacitor (100a or 100b). This coupling to the self-test bias voltage preferably occurs during the reset period ($\Phi_{RESET}$). Both self-test voltage inputs are decoupled from self-test bias voltage and also from ground potential (GND) during the readout period ($\Phi_{READ\_CH1}$). Preferably, during bias period, any of the self-test voltage inputs that are not coupled to a self-test bias voltage are coupled to zero voltage (ground potential). When the self-test bias voltage is coupled to the respective self-test voltage input net (108a, 108b) and thus towards the respective capacitive element, the self-test bias voltage causes an electrostatic force which further causes a deflection to the capacitive element. The caused deflection of the rotor of the capacitive element may be detected during the readout period ($\Phi_{READ\_CH1}$) of the inertial channel and applied to determine how the following self-test bias voltages are fed to the same or different inertial channels and finally whether the capacitive element operates normally or not.

In order to enable detection and self-test to be performed for multiple capacitive elements, a multiplexing scheme may be used. In a front-end multiplexing scheme, more than one capacitive elements may be connected to the same readout circuitry (104), while each of the capacitive elements has an individually controlled first switching arrangement S1 (106). A suitable front-end multiplexing scheme may be selected, taking into account the characteristics of the capacitive elements. Multiple capacitive elements of a MEMS sensor device may be self-tested serially one by one.

Self-testing for capacitive elements which deflect and return quickly may be tested essentially serially, in other words one by one, so that the self-test bias voltage is fed to one capacitive element at a time during a number of consecutive reset periods ($\Phi_{RESET}$), while the readout circuitry (104) is configured to read the same capacitive element during the following readout periods ($\Phi_{READ\_CH1}$). Self-test bias voltage pulses may be repeatedly coupled to one of the electrodes (100a, 100b) of the same capacitive element under self-test. After the capacitive electrode under self-test reaches the intended amount of reflection, no more self-test bias voltage pulses are fed towards this electrode. After either the reflected element has returned essentially to the position that it had before biasing or directly after reaching required deflection in one direction, the capacitive electrode (100a, 100b) of the same capacitive element to be subject to the self-test bias voltage may be changed, so that the capacitive element will be next deflected to opposite directions. When just one capacitive element is tested at a time, repetition rate of the self-test bias voltage pulses, rms magnitude of the self-test bias voltage and also detection of the capacitive element occurs at maximum available speed, so that obtained self-test data rate for the channel under testing may be maximized.

A single discrete-time self-test bias pulse may even be fed to a capacitive electrode of more than one capacitive elements at a time. If a common high voltage bias generation circuitry is multiplexed for generating the self-test bias voltage for multiple capacitive elements, it's possible to feed this same high voltage self-test bias voltage to one or more capacitive elements at a time, as long as the high voltage value needed for deflecting these capacitive elements is the same. However, this would complicate detection of the capacitive elements, and may for example require more than one readout circuitries (104) for simultaneously detecting movement of more than one capacitive elements. This kind of arrangement may still be useful if the capacitive element movements are slow compared to the time periods used for biasing and readout, so that high number of biasing periods are needed for deflecting the rotor mass to the wanted amount of deflection.

In order to enable use of a single common readout circuitry (104), a temporal multiplexing scheme may be used in which a self-test bias voltage is applied to one capacitive element at a time, and after exciting the capacitive element a period is reserved for detecting settling of the capacitive element toward zero bias condition. All elements may be detected by a single, shared readout circuitry (104) using a temporally multiplexed detection scheme. During a first reset period ($\Phi_{RESET}(n)$), a self-test bias voltage is applied to a first capacitive element, which element is subsequently read (detected) during a following first readout period ($\Phi_{READ\_cHn}$). During a following reset period ($\Phi_{RESET}(n+1)$), same electrode may continue to be biased with the high voltage self-test bias voltage or the bias voltage may be changed to zero voltage to allow the inertial channel to start settling toward zero bias condition, and the level of settling is then detected during a following second readout period ($\Phi_{READ\_CHn+1}$). Detecting the level of settling may refer to detecting any suitable parameter indicating the position of the capacitive element as known by a person familiar with the art. The high voltage self-test bias voltage values used for different capacitive elements may be like, or they may be different from each other.

Figure 2:
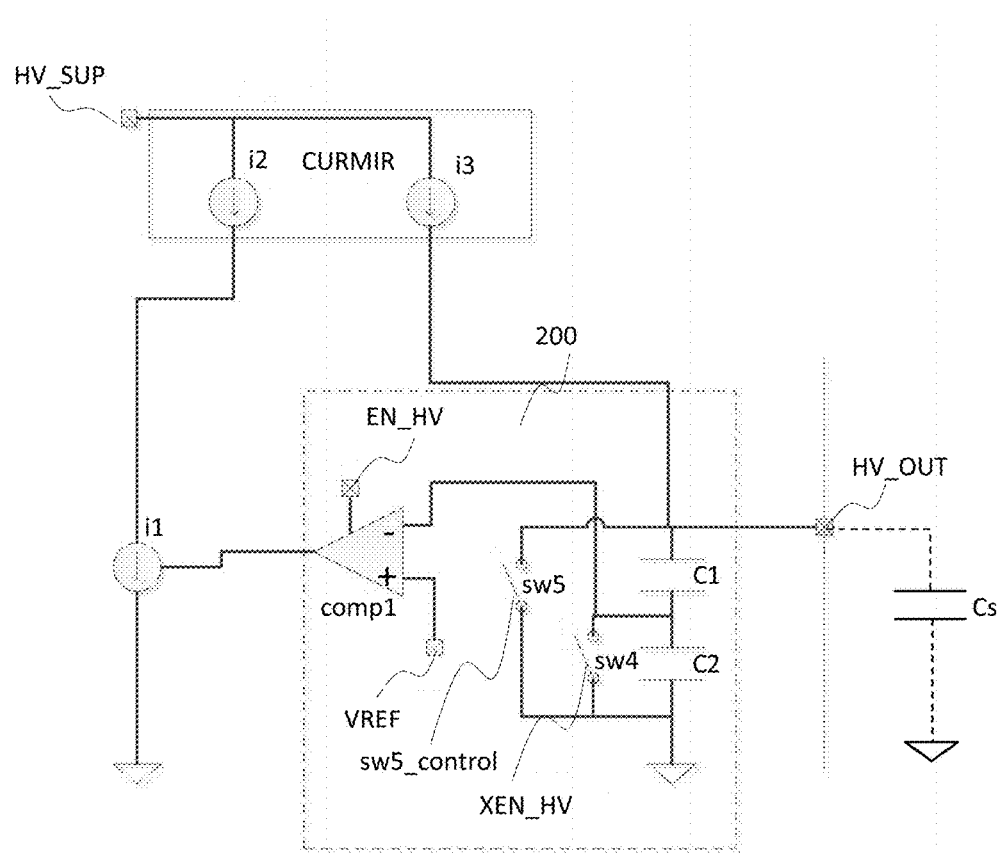
FIG. 2 is a first embodiment of a discrete-time variable high voltage generating circuitry.
Figure 3:
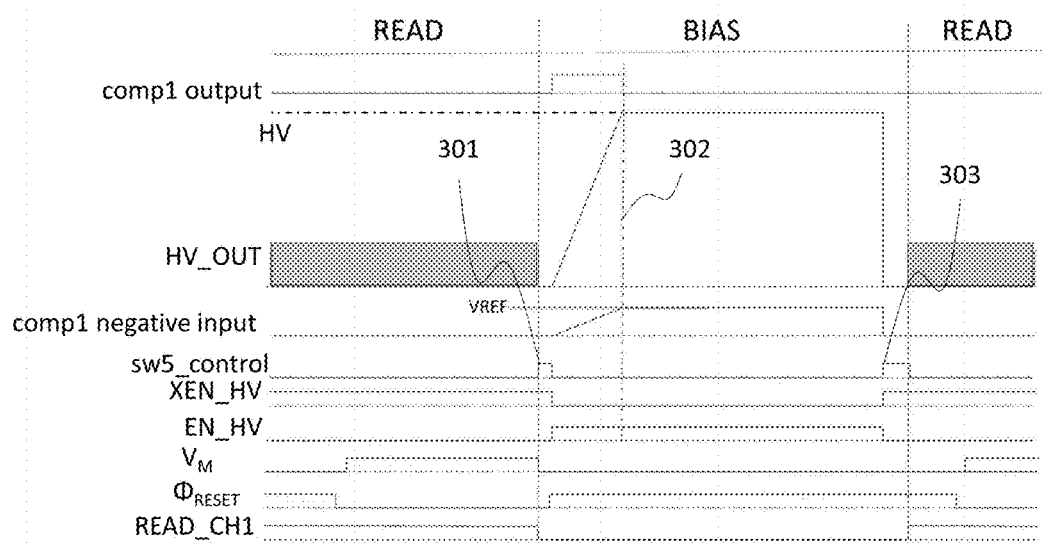
FIG. 3 illustrates timing of different signals in a high voltage generating circuitry.

FIG. 2 illustrates a first embodiment of a discrete-time variable high voltage generating circuitry for generating a discrete-time high voltage. FIG. 3 illustrates timing of different signals in the circuitry of FIG. 2. Functionality of the high voltage generating circuitry will be described using these two figures in parallel.

A general purpose DC high-voltage source (HV_SUP) with low output current capability and the discrete-time nature of accelerometer interfaces as illustrated in connection to FIG. 1 may be utilized for generating discrete-time self-test bias voltages such as $V_{ST11}$, $V_{ST12}$ in FIG. 1. A discrete-time capacitive MEMS sensor front-end may be configured to self-testing by only changing a clocking scheme of the switches of the MEMS sensor front-end to suit for a self-test operation. During reset periods ($\Phi_{RESET}$), i.e. when control signal $\Phi_{READ}$='0' so that the readout circuitry (104) is not coupled to the capacitive elements (100a, 100b), either of the self-test bias voltages ($V_{ST11}$, $V_{ST12}$) coupled to the respective self-test voltage nets (108a, 108b) may be used to bias the respective sensor element stator to any voltage level in order to create an electrostatic force deflecting the rotor. We can call this period of coupling the bias voltage as the BIAS period or as a biasing period. A BIAS period preferably at least partially overlaps with a reset period ($\Phi_{RESET}$). BIAS periods may be configured to occur only with selected reset periods ($\Phi_{RESET}$), and the reset period ($\Phi_{RESET}$) preferably continues until all transient currents possibly caused at the end of the BIAS period have been essentially settled. FIG. 3 illustrates an example of relative timing of a BIAS period and a reset period ($\Phi_{RESET}$). Stators of the sensor elements correspond to the electrodes of the variable capacitors (100a, 100b) that are coupled towards the self-test bias voltage nets ($V_{ST11}$, $V_{ST12}$), as well as towards the first switches S1 (106). Rotor element is connected to a readout voltage ($V_M$). The readout voltage ($V_M$) may be set to zero voltage during the BIAS period, in order to maximize the potential difference and thus the deflecting force caused by a self-test bias voltage ($V_{ST11}$, $V_{ST12}$). When the transition rate between consecutive BIAS and readout periods READ is designed to be high, e.g. 100 kHz, the deflection level per single BIAS period becomes small e.g. ~100 mg (where g stands for standard acceleration due to gravity) and the signal information is received at high rate compared to rotor mass deflection rate. During readout periods (READ), when the selected channel is to be read by the readout circuitry, the general purpose high-voltage (HV) source may have a high impedance state, thus not having any significant effect on the signal detected from the stators. In FIG. 3, a timing diagram is shown for reading a first exemplary channel (CH1) during readout periods (READ) when a first channel read control signal (READ_CH1) is in logical high state.

The discrete-time variable high voltage generating circuitry includes a current mirror (CURMIR) comprising two main current mirror transistors (i2, i3). The second current mirror transistor (i2) may be diode connected and the third current mirror transistor (i3) may be configured to function as a current source. Alternatively, the current mirror circuitry for current mirror transistors (i2, i3) may be implemented in any manner known to a person familiar in the art. Output of the high voltage generating circuitry, which we may call in short as the high voltage output (HV_OUT), is in zero current state during readout periods (READ) as illustrated with the greyed boxes in FIG. 3, since the third current mirror transistor (i3) outputs zero current. During the readout periods, when the high voltage output (HV_OUT) is in the zero current state, the high voltage output (HV_OUT) may also be externally biased to any bias voltage between zero and a nominal supply voltage. The third current mirror transistor (i3) may be set to zero current state also during the high voltage periods, after the high voltage value in the high voltage output (HV_OUT) of the high voltage generating circuitry reaches the intended high voltage value (HV).

For explaining the operation of the discrete-time high voltage generation circuitry, a circuitry providing high voltage for a single inertial channel is first illustrated in FIG. 2. This circuitry is enabled using a single high voltage enable control signal (EN_HV). The impedance of a first voltage division capacitor (C1) may be considered insignificant from total stator net impedance point of view. Term stator net refers to a net into which the output of the discrete-time high voltage generation circuitry is coupled to, such as net 108a or 108b in FIG. 1, and to the circuitry coupled to this net. Term stator net impedance refers to net impedance towards the circuitry into which the high voltage is fed into, such as net 108a or 108b in FIG. 1. In the circuitry of FIG. 1, the most significant impedances detected in a stator net are impedance of a variable capacitor (100a or 100b) and the feedback capacitance of the operation amplifier in the readout circuitry (104). Thus, the load caused by a stator net is essentially capacitive. This load capacitance Cs caused by a stator net is illustrated with capacitor Cs connected to the high voltage output net (HV_OUT) in FIG. 2. When the biasing state (BIAS) begins, the voltage division network including first and second voltage division capacitors (C1, C2) may first be reset in order to precisely set the initial condition of voltage division capacitors (C1, C2) by shortly closing the first reset switch (sw5), which causes short circuit of the voltage division capacitors to ground potential, and thus also the output of the high voltage generating circuitry (HV_OUT) to ground (zero volts). We'll call this output as the high voltage output (HV_OUT). Closing the first reset switch (sw5) essentially discharges the first voltage division capacitor (C1). The second reset switch (sw4) is controlled by an inverted high voltage enable signal (XEN_HV), and it may be kept closed during the entire readout period (READ) so that it's already closed, and there is no need for separately closing the second reset switch (sw4) at this point. The first reset switch (sw5) is opened again after the short closing period in order to enable high impedance state of the high voltage output (HV_OUT) needed both for biasing (BIAS) and readout (READ) states. The short reset period of the voltage division capacitor (C1) is shown in FIG. 3 as a short logical high pulse (301) in the first reset switch control signal (sw5_control) just after start of the biasing state (BIAS). The second reset switch (sw4) is configured to short circuit the second voltage division capacitor (C2) to ground, when high voltage generation is not enabled, and to ensure that input to the positive input (+) of a comparator (comp1) has zero voltage value when generation of the high voltage is initiated. Short circuited second voltage division capacitor (C2) allows also stable high voltage output (HV_OUT) potential readout period (READ). The second reset switch (sw4) is opened only for the duration of the high voltage period, which is a subset of the biasing period (BIAS). This is illustrated by inverted control signals EN_HV and XEN_HV. Preferably, the second reset switch (sw4) is opened at the same time with the first reset switch (sw5) when generation of the high voltage is started during the BIAS period, and closed at the time of closing the first reset switch (sw5) for resetting the high voltage value (HV) to zero voltage, when the end of the BIAS period is approached.

The comparator (comp1) is configured to provide in its output a logical signal, which is configured to be used for controlling provisioning of a slew current, thus controlling generation of the high voltage in the high voltage output (HV_OUT). When the comparator (comp1) output is in logical high state, the current mirror is activated and a constant current is allowed to flow through the current mirror (CURMIR) by setting a current mirror control transistor (i1) in conducting state. When the current mirror is activated by setting the current mirror control transistor (i1) in conducting state, a reference current flows through the second current mirror transistor (i2) and causes an output current (a.k.a. slew current) through the third current mirror transistor (i3), which causes controlling the generation of the discrete-time high voltage in the high voltage control circuitry (200), and generation of the high voltage at the high voltage output (HV_OUT). The same high voltage value is also seen over the voltage division network capacitors. Although the current mirror control transistor (i1) is not included within the high voltage current mirror (CURMIR) circuitry "box", it may be considered as an integral part of the current mirror, since it is used to set the current mirror (CURMIR) in active operating state. The current mirror control transistor (i1) is configured as a controlled current source, which outputs zero current with logical zero ("0") control value at its gate. With a logical one ("1") value at the gate, the current mirror control transistor (i1) outputs a predefined current value. This predefined current value may be based on a required slew rate of the high voltage output (HV_OUT) and maximum allowed peak current load of the high voltage supply (HV_SUP), while also taking into account the current mirror ratio. Slewing of high voltage output (HV_OUT) starts as shown in FIG. 3, when the current mirror (CURMIR) copies the reference current through the second current mirror transistor (i2) to the third current mirror transistor (i3) and it is assumed that direct current (DC) impedance of the high voltage output (HV_OUT) is very high (>10 Gohm) and that the load impedance at the high voltage output (HV_OUT) caused by a self-test voltage input net (108a, 108b) coupled to the high voltage output (HV_OUT) is capacitive. This current through the third current mirror transistor (i3) may be called as the output current or as the slew current from the current mirror (CURMIR). As understood by a person familiar with the art, this slew current is shared essentially between circuitries seen at the output of the current mirror (CURMIR), such as for example the capacitive voltage division network, sensor detection capacitance, routing and ESD parasitic capacitive load. Part of the slew current goes towards the high voltage control circuitry (200) and part of it goes towards the capacitive load Cs. Slewing of the voltage in the high voltage output (HV_OUT) caused by the slew current continues as long as the divided high voltage value DHV=C1/(C1+C2)*HV_OUT, is smaller than the low-voltage reference voltage (VREF) in the input of the comparator (comp1). The comparator (comp1) is enabled by the high voltage enable control signal (EN_HV) only during a period when the high voltage generation is allowed. This high voltage period is preferably a subset of the biasing period (BIAS). When the divided high voltage value DHV=C1/(C1+C2)*HV_OUT reaches or exceeds the low-voltage reference voltage value (VREF), the comparator (comp1) changes its output to low-value, thus providing a logical low value towards the gate of the current mirror control transistor (i1) and thus disabling current through the current mirror control transistor (i1), and subsequently disabling (inactivating) the current mirror (CURMIR), causing the slew current to cease. In inactive state, the current mirror (CURMIR) provides zero current in its output. This moment is illustrated with a dashed vertical line (302). Zero current is respectively copied in the current mirror (CURMIR) and slewing of the high voltage output (HV_OUT) ceases. An essentially constant high voltage (HV) is maintained in the high voltage output (HV_OUT) nearly as long as the biasing state (BIAS) continues. Also the capacitive load seen in the stator net (108a, 108b) has essentially been charged by part of the slew current into the same high voltage value. The high voltage level (HV) at the high voltage output (HV_OUT) may be considered essentially constant during the high voltage period even after deactivating (disabling) the current mirror when the intended high level value has been reached, because the DC impedance in stator net is high and all current sources connected to this net are set to zero value. Additionally, the single BIAS state period length can be considered short with respect to mechanical signals and therefore the total capacitance change in the stator net can be considered insignificant and high voltage level (HV) remains unchanged. Before entering the readout state (READ) again, it is feasible to reset the high voltage output (HV_OUT) so that high voltage (HV) is not passed to the MEMS sensor front-end, in other words a MEMS element and electronic front-end circuitry. This high voltage reset may be seen as another a logical high pulse (303) in the first reset switch control signal (sw5_control) just before the end of the biasing state (BIAS), effectively closing the first reset switch (sw5) for the duration of this pulse, short circuiting the high voltage output (HV_OUT) to ground and closing the second reset switch (sw4), thus discharging both voltage division capacitors (C1, C2). The high voltage output (HV_OUT) of this exemplary circuitry may be utilized for supplying a self-test bias voltage, such as $V_{ST11}$ and $V_{ST12}$ of FIG. 1. The second reset switch (sw4) is closed preferably at the same time with closing the first reset switch (sw5), in order to ensure precise reset value of both voltage division capacitors (C1, C2). The second reset switch (sw4), controlled by the inverted high voltage enable control (XEN_HV) signal, stays closed after the first reset switch (sw5) reset is deactivated, in order to ensure that there is no slowly changing charge component in the second voltage division capacitor (C2) that could compromise the stability of the readout phase (READ). The second reset switch (sw4) may remain closed for the entire duration of the readout state (READ), as it does not have significant effect on the high voltage output (HV_OUT) impedance during the readout period (READ).

For controlling the generation of the high voltage (HV) and maintaining of the essentially constant high voltage (HV) value at the high voltage output (HV_OUT), some hysteresis may be configured in the comparator (comp1). Logical high value may be enabled in the comparator (comp1) output right at crossing of the zero voltage level in start of the biasing period. Logical low value may be provided only after moderately significant drop in the high voltage output (HV_OUT) voltage, e.g. 5% below the nominal value, in order to prevent oscillation of control loop at the comparator zero crossing point. A logical low value is provided at the output of the comparator (comp1) whenever the high voltage control signal (EN_HV) has a logical low value, indicating that high voltage shall not be generated.

With the high voltage circuitry topology illustrated in FIG. 2, generation of discrete-time variable high voltage output (HV_OUT) is possible in a range between ground and high voltage supply voltage (HV_SUP) minus the saturation voltage of the third current mirror transistor (i3), provided that the comparator (comp1) causes no limitation of the operating range. The needed slew current from the high voltage supply (HV_SUP) may be decreased by allowing a longer time period for generation of the high voltage during each biasing state (BIAS). A longer biasing period (BIAS) also allows less stringent delay requirements for the comparator (comp1) when further reduction of current consumption is needed. On the other hand, leakage requirement becomes the higher the longer the holding time of floating high voltage value in the high voltage output (HV_OUT). A longer biasing period (BIAS) also decreases the rate at which capacitance values can be read using the MEMS sensor front-end during readout period (READ). The capacitive load seen in the stator net is also charged by the slew current from the current mirror (CURMIR) essentially into the same high voltage value (HV) as the high voltage output (HV_OUT). The time period needed to hold the high voltage value (HV) in the high voltage output (HV_OUT) during part of the biasing period (BIAS) after disabling the current mirror (CURMIR) is relatively short, typically in the order of few tens of microseconds. During this short period, no mechanical transient of the MEMS element variable capacitor nor possible small current leaks in the circuitry cause any significant change of the high voltage value (HV) in the capacitive load in the stator net. Thus, the high voltage value (HV) in the high voltage output (HV_OUT) voltage level may be considered essentially stable during the part of the biasing period (BIAS) when the intended high voltage value (HV) is held.

Table 1 illustrates values of operation parameters achieved with an exemplary discrete-time high voltage generation circuitry as illustrated in FIG. 2.

TABLE 1

| Operation parameter | Value |
| --- | --- |
| load capacitance HV_OUT | $1.50*10^{-12}$ F |
| HV reference current through i1 and i2 (i1 @ control high) | $1.00*10^{-6}$ A |
| HV slew current through i3 (i1 @ control high) | $1.00*10^{-5}$ A |
| BIAS state length (including sw5 reset times) | $7.50*10^{-6}$ s |
| READ-state length | $2.50*10^{-6}$ s |
| High Voltage output target | 10.0 V |
| slew time | $1.50*10^{-6}$ s |
| RMS voltage of HV_OUT | 8.1 V |
| average HV_SUP load current | $1.65*10^{-6}$ A |

It may be seen that RMS high voltage output of 8V may be attained with average current from high voltage supply (HV_SUP) as low as 1.65 µA, when capacitive load of the stator net visible at high voltage supply (HV_SUP) is assumed to be 1.5 pF and readout rate is 100 kHz (7.5 µs for BIAS and 2.5 µs for READ). The number high voltage tolerant transistors is minimal—three in the current mirror (i1, i2, i3), a reset switch (sw5) and high voltage tolerant series switches, such as for example switches S1 in FIG. 1.

In a multiplexed sensor system, it's possible to use more than one discrete-time high voltage generating stages according to FIG. 2 in parallel.

Figure 4:
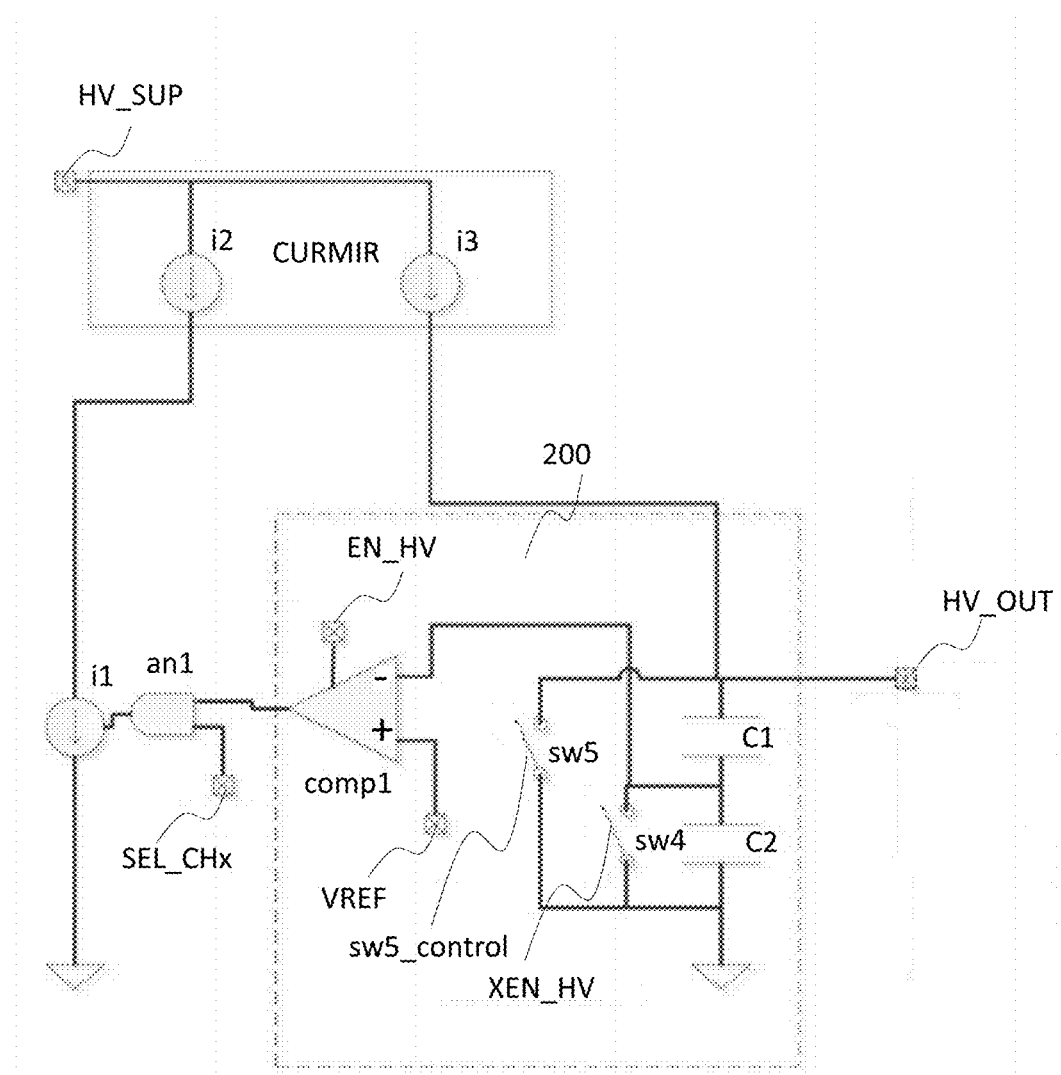
FIG. 4 illustrates a second embodiment of a discrete-time variable high voltage generating circuitry.

FIG. 4 illustrates a second embodiment of a discrete-time variable high voltage generating circuitry for generating a discrete-time high voltage. In addition to the circuitry elements shown in FIG. 2, this embodiment further includes a logical summing (AND) element (an1), which may be used for selecting a specific inertial channel for high voltage self-test biasing in case of more than one capacitive elements in the same circuitry. Each current mirror (CURMIR) for the more than one capacitive elements is enabled with an additional logical channel selection signal (SEL_CHx). The AND-element provides a logical high in its output and at the gate of the current mirror control transistor (i1), when both the channel selection (SEL_CHx) signal and the output of the comparator (comp1) produce a logical high signal. When a specific channel has been selected for self-test biasing, duty cycle of this specific channel selection signal (SEL_CHx) may be the same as the duty cycle of high voltage enable signal (EN_HV). At any other times the channel selection signal (SEL_CHx) is set to logical low value independent of the high voltage enable signal (EN_HV), thus disabling the respective current mirror (CURMIR). Such other times include periods when another channel is subject to self-test biasing, readout periods, and periods when the MEMS sensor is in normal operation more after start-up self-testing has been completed. It is understood by a person familiar with the art, instead of an AND-element as shown in any of the examples shown, a variety of logic circuitry may be configured to perform the necessary logical function to control the current mirror control transistor (i1). For example, the logic circuitry may comprise one or more AND, NAND, NOR and/or inverter ports.

Providing further isolation of the two voltage division capacitors (C1, C2) from the high voltage output (HV_OUT) and thus also from the MEMS stator net input during readout state (READ) may be advantageous. Not only it ensures that no bias voltage is fed towards the readout circuitry (104) during readout state (READ), but a switching system also enables reusing parts of the discrete-time high-voltage generating circuitry for multiple capacitive MEMS devices in multiplexed manner. The shareable common high voltage control circuitry (200) has been marked in FIGS. 2, 4 and 5 with a dashed line. Beneficially, this common high voltage control circuitry (200) includes relatively large components of the circuitry, such as the voltage division capacitors (C1, C2), the comparator (comp1) and a high voltage tolerant reset switch (sw5). It is understood by a person familiar with the art that the reset switch (sw5) may be implemented with a high voltage tolerant transistor.

Figure 5:
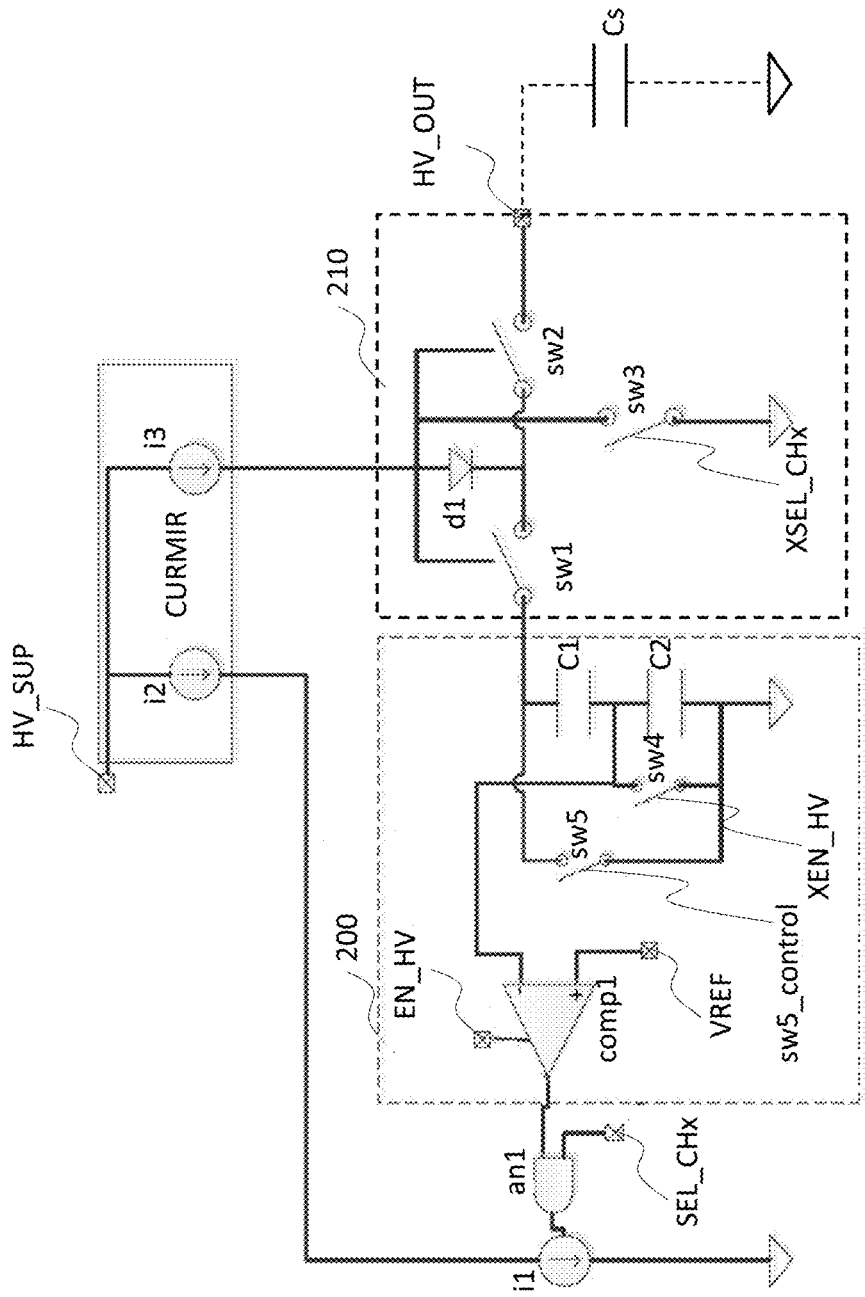
FIG. 5 illustrates a third embodiment of a discrete-time variable high voltage generating circuitry for generating a discrete-time high voltage.

FIG. 5 illustrates a third embodiment of a discrete-time variable high voltage generating circuitry for generating a discrete-time high voltage. The circuitry now includes an additional isolating switching stage (210) comprising three switches (sw1, sw2, sw3) and a diode (d1). This isolating switching stage (210) provides improved isolation of the voltage division capacitors (C1, C2) from the high voltage output (HV_OUT). A first switch (sw1) is used to selectively connect the isolating switching stage (210) towards the high voltage control circuitry (200). The second switch (sw2) is connected from the isolating switching stage towards the high voltage output (HV_OUT). When both the first switch (sw1) and second switch (sw2) are closed, the slew current from the third current mirror transistor (i3) causing the high voltage bias is connected to the high voltage control circuitry (200) and to the high voltage output (HV_OUT). First and second switches (sw1, sw2) may be controlled by generating a local gate bias voltage over a diode (d1) using part of the slew current provided by the third current mirror transistor (i3). Comparator (comp1) output is connected towards the gate of the current mirror control transistor (i1) through a logical summing element (an1) configured for channel selection.

During high voltage generation during the biasing period, part of the slew current is transferred through the diode (d1) of the switching stage (210), which increases the gate bias of first and second switch transistors (sw1, sw2) and consequently these switch transistors are conducting, so that the high voltage is connected to the high voltage output (HV_OUT). The third switch (sw3) used for controlling the first and second switch transistors (sw1, sw2) is itself controlled by the inverted channel selection signal (XSEL_CHx). Thus, the third switch (sw3) couples the gates of the first and second switch transistors (sw1, sw2) to ground (logical "0") and thus keeps the first and second switch transistor in non-conducting state whenever the discrete-time high voltage generation circuitry is in readout state or when the circuitry is in biasing state but when high voltage bias is not to be provided to the high voltage output. After the intended high voltage value is reached in the high voltage output (HV_OUT) and the slew current from the current mirror (CURMIR) is disabled (set to zero current), also the capacitive load of the stator network has been charged into the high voltage value (HV) as in earlier examples. Although the isolating switching stage (210) then disconnects the high voltage control circuitry (200) from the stator net connected to high voltage output (HV_OUT), the high voltage value (HV) is essentially maintained both in the high voltage control circuitry (200) and in the capacitive load of the stator net, illustrated with capacitor Cs, during the remaining high voltage part of the biasing period. The only additional parasitic load caused towards the connected isolated self-test voltage input net (108a or 108b) by the high voltage biasing during readout state is that inflicted by the second switch (sw2). Therefore the effect of high voltage biasing and deflection setup has minimal effect on MEMS sensor operation. As the floating high voltage (HV) is maintained in the stator net only for a relatively short time period, no mechanical transient of the MEMS element nor any leakage current in the stator net or in the isolating switching stage (210) causes significant change in the high voltage value during the remaining high voltage part of the biasing period (BIAS). The high voltage value (HV) is only discharged by closing the respective inverted channel selection switch (S3 in FIG. 1) thus coupling the stator net (self-test input net) to ground for discharging the high voltage (HV).

Figure 6:
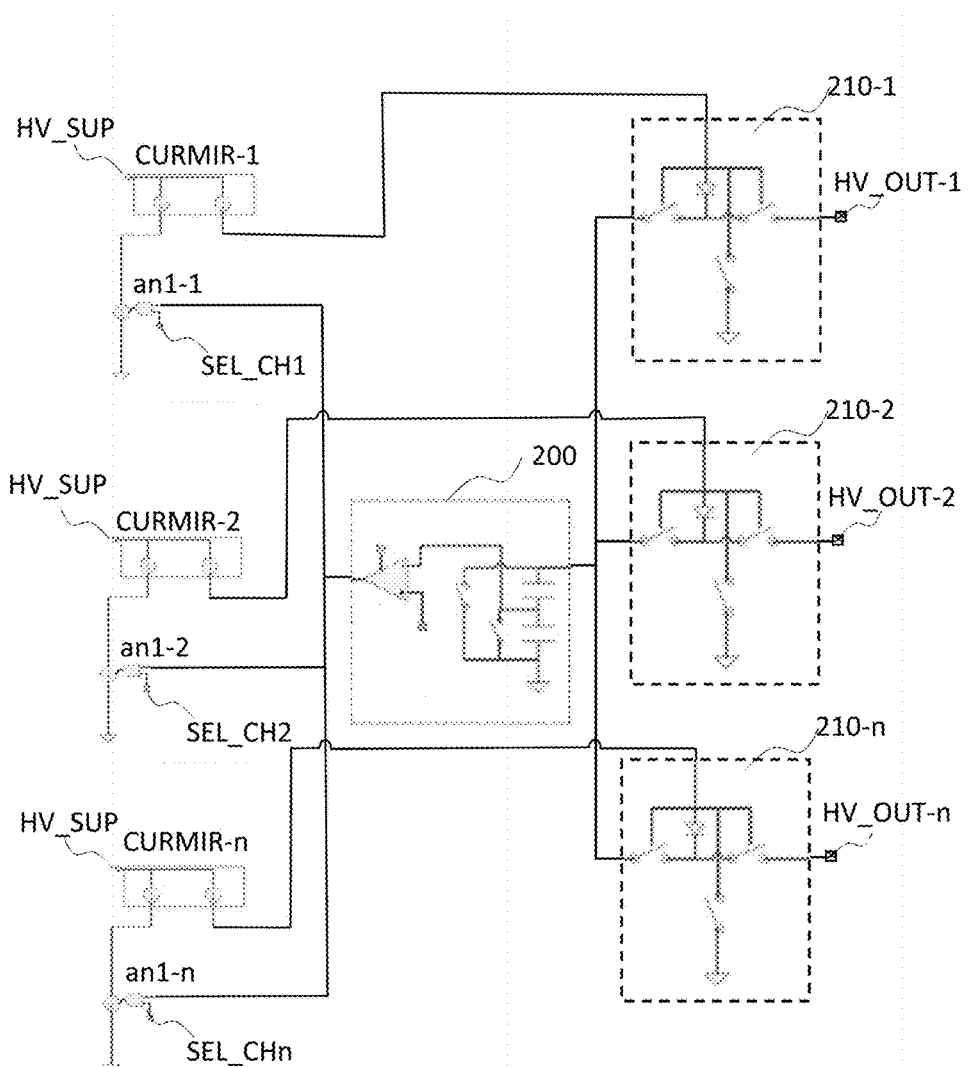
FIG. 6 illustrates a circuitry with more than one discrete-time variable voltage generating circuitries having a shared high voltage circuitry.

Using a number of circuitries of FIG. 5, more than one isolated discrete-time high voltage outputs (HV_OUT) may be provided. An example of such configuration is illustrated in FIG. 6. For clarity reasons, not all references for individual components are shown in FIG. 6, but components are referred by similar references as in FIG. 5 plus a numeral indicating which one of the circuitries the signal or component is related to. The number of high voltage outputs (HV_OUT-1, HV-OUT-2, . . . , HV_OUT-n) in this example is n, which may be any natural number. N switching stages (210-1, 210-2, . . . , 201-n) are preferably provided, wherein each of the switching stages (210-1, 210-2, . . . , 201-n) may be connected to the common high voltage control circuitry (200). More specifically, the n first switch transistors (sw1-1, sw1-2, . . . , sw1-n) are coupled to the electrode of the first voltage division capacitor (C1) of the high voltage control circuitry (200) providing the high voltage for output. A configuration with just one common high voltage control circuitry (200) is beneficial as only one set of voltage division capacitors (C1, C2) and just a single comparator (comp1) is needed. Component sharing enables saving of total chip area, as capacitors, in particular, tend to require relatively large chip areas. It further allows same common high voltage control circuitry (200) to be used for all high voltage output (HV_OUT) signals, which eliminates possible mismatch in for example capacitive voltage division or comparator properties such as offset, which may occur in case the number of common high voltage control circuitries (200) were higher than one. Comparator (comp1) output from the high voltage control circuitry (200) may be connected to n AND-ports (an1-1, an1-2, . . . , an1-n), and only one of these AND-ports is activated during a specific biasing period by setting the corresponding control signal (SEL_CHx) to high (x refers to any one of 1, 2, . . . ,n), thus allowing the corresponding current mirror (CURMIR-x) to be controlled with the comparator (comp1). For n high voltage outputs, there are n SEL_CHx-signals, which may be named for example SEL_CH1, SEL_CH2, . . . SEL_CHx. Any one of these channel selection signals (SEL_CHx) may be activated during a specific biasing period, enabling the respective current mirror to be activated for generating the respective high voltage output signal (HV_OUT), while the others remain inactive so that the high voltage outputs (HV_OUT) of the inactive channels remain in high impedance state. At the same time, the closed third switches (sw3-1, sw3-2, . . . sw3-n) of the non-selected switching stages (210-1, 210-2, . . . 210-n) controlled by the inverted channel selection signals (XSEL_CHx) ensure that all the non-selected high voltage outputs (HV_OUT-1, HV_OUT-2, HV_OUT-n) are disconnected from the common high voltage control circuitry (200). If rotors of the more than one capacitive elements are not independent, but share a common rotor potential ($V_M$), it's not possible to use other elements for detecting acceleration when one element is subject to self-testing, since self-testing process may require connecting the rotor to ground potential (zero voltage). Thus, if the rotors share a common rotor potential ($V_M$), all rotors of the MEMS device will be connected to zero voltage for self-testing any one of the capacitive elements, and just a single capacitive element at a time may be excited with a high voltage self-test bias during the biasing period and read during a following readout period. In an arrangement with more than one independent rotor potentials, it is possible to use more complicated multiplexing configurations and for example read actual acceleration detection signal from another inertial channel during a biasing period of one channel.

Sharing of one high voltage control circuitry (200) between multiple capacitive elements requires that only one capacitive element is excited using the high voltage bias at a time, since just one independently controlled high voltage bias may be generated at a time. Further, generating discrete-time high voltages for multiple channels simultaneously might cause unacceptably high load current from the high voltage supply voltage (HV_SUP) source. In addition to enabling sharing of the high voltage control circuitry (200) between multiple capacitive MEMS elements, the switching stage (210) also improves isolation of the high voltage outputs (HV_OUT1, HV_OUT2, . . . , HV_OUTn) from high voltage supply voltage (HV_SUP) during readout periods, and also improves isolation of the first voltage division capacitor (C1) from the stator net during readout periods.

As long as only one current mirror is activated (a.k.a. enabled) at a time, no significant high voltage supply (HV_SUP) load current is inflicted any of the n switching stages (201-1, 201-2, 210-n). Further, no additional high voltage supply (HV_SUP) load is incurred by any of the number of isolated high voltage output connections (HV_OUT-1, HV_OUT-2, . . . HV_OUT-n) used as self-test bias voltages of the MEMS elements. Leakage currents due to the inactive (a.k.a. disabled) current mirrors (CURMIR) is negligible and may thus also be ignored; no significant additional load current is caused by any of the n current mirrors (CURMIR-1, CURMIR-2, . . . , CURMIR-n) to the high voltage supply (HV_SUP).

In case of multiple isolated high voltage outputs (HV_OUT-1, HV_OUT-2, . . . HV_OUT-n), in the one that is used for providing a high voltage during the selected biasing period, a part of the slew current is transferred through the diode (d1) of the respective switching stage (210), which increases the gate bias of the first and second switches (sw1, sw2) and consequently these transistors are conducting, so that the high voltage is connected to the respective high voltage output (HV_OUT). In the high voltage outputs (HV_OUT) that are not used for supplying high voltage, both the gate and the source of the second switch (sw2) is connected to ground by closing the third switch (sw3), so that no current is caused to any of the unused high voltage outputs (HV_OUT). The gates of the first switches (sw1) of unused inertial channels are also connected to ground, thus ensuring that these switches remain open. A person familiar in the art understands that switches (sw1, sw2, sw3) of the isolating switching circuitry may be implemented using transistor, and that a closed switch refers to situation where the transistor is in a conducting state and an open switch refers to situation where the transistor is in a non-conducting state. The first switch (sw1) of each of the n switching stages is selectively connectable to the first voltage division capacitor (C1) common to all high voltage generation circuitries, while the high voltage output (HV_OUT) may be connected to isolated stator nets for which the controllable high voltage self-test bias needs to be generated.

Figure 7:
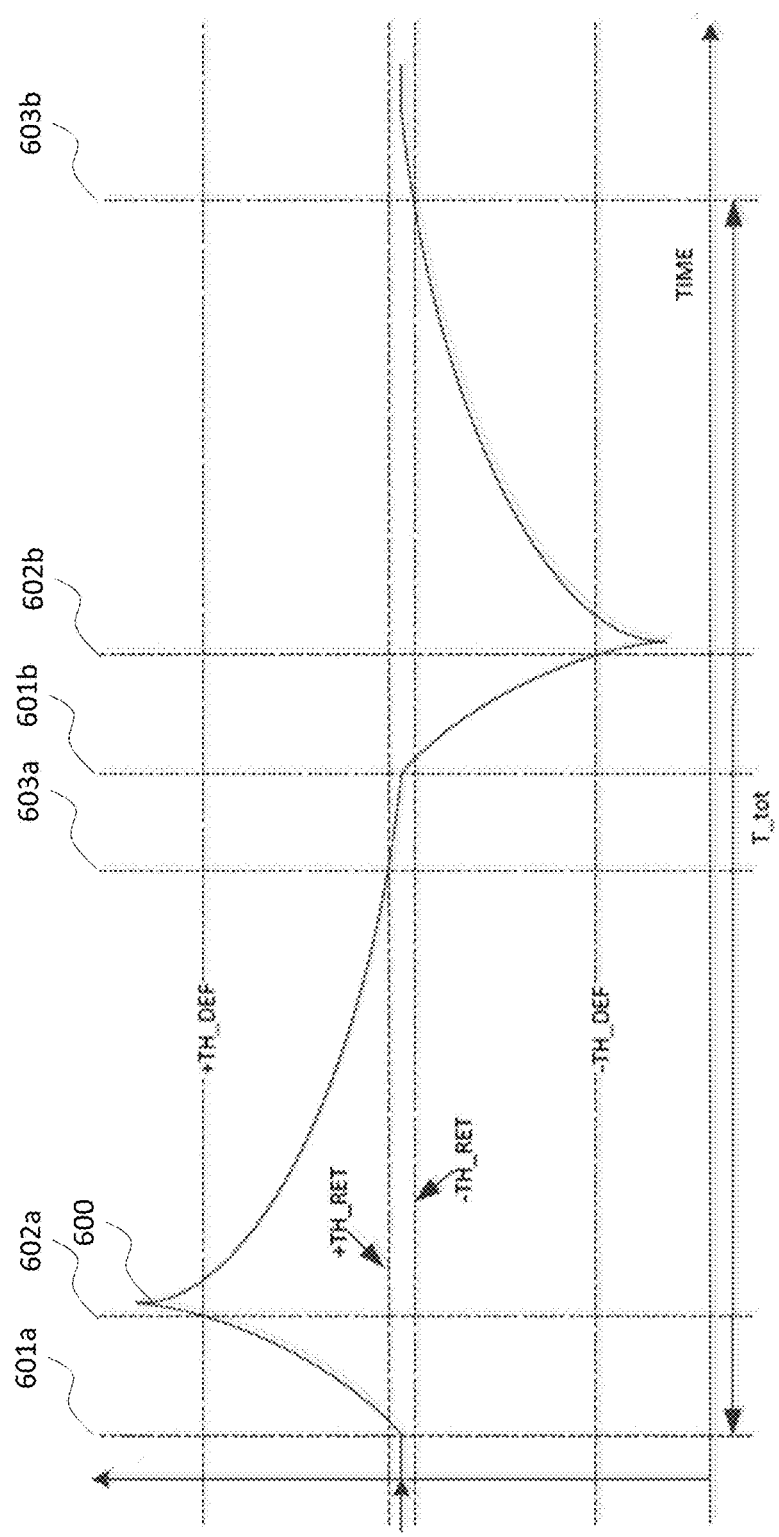
FIG. 7 illustrates detected movement of a MEMS sensor element under self-test.
Figure 8:
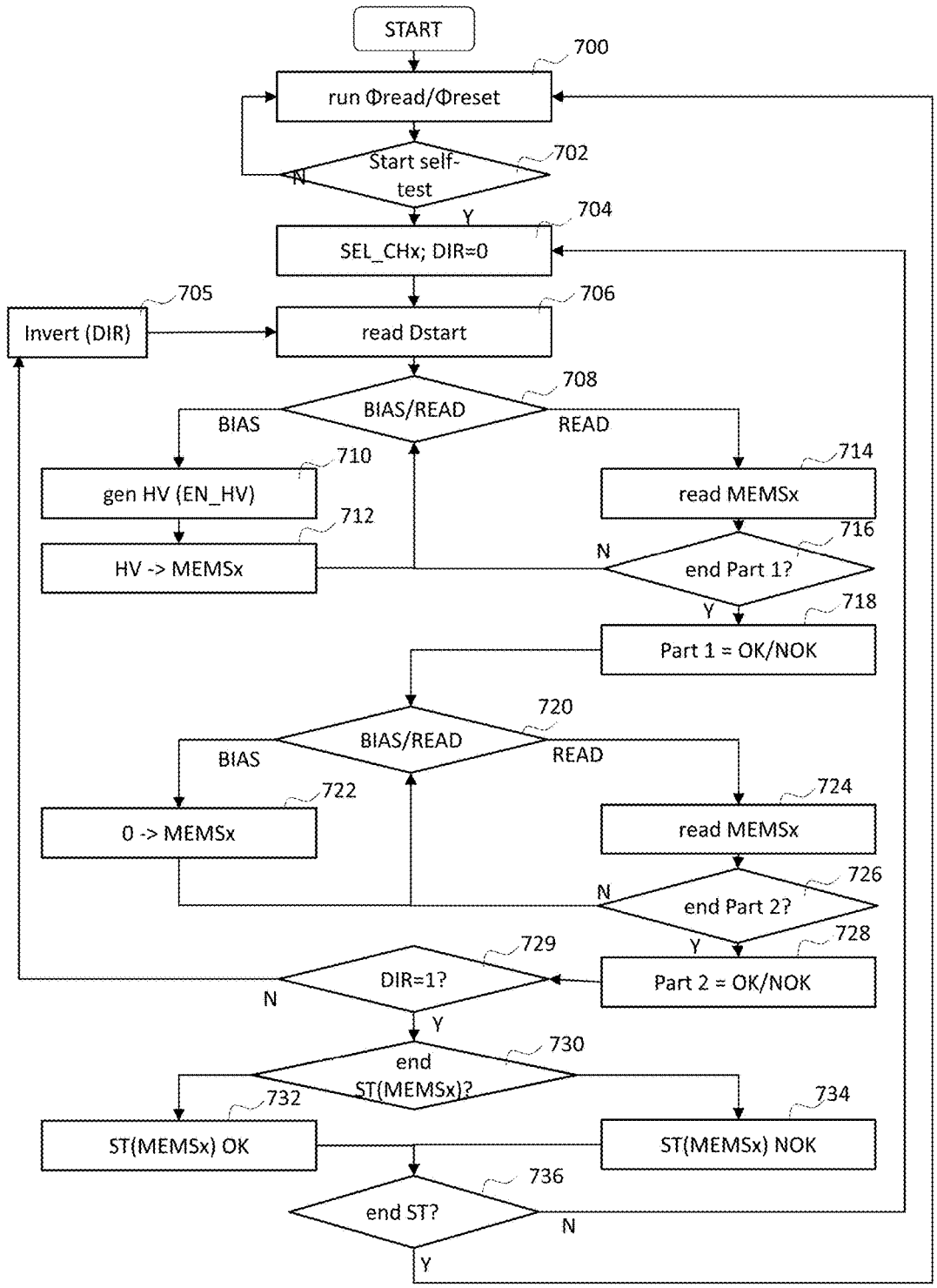
FIG. 8 illustrates an exemplary flow chart for a self-test method.

FIGS. 7 and 8 illustrate aspects of a self-test process utilizing the circuitry described above for generating the discrete-time high voltage as self-test bias voltage. The discrete-time high voltage circuitry may be configured to move the rotor mass (rotor) over the whole possible range (amplitude) of movement, or just over the specified dynamic range for the rotor mass. When the self-test is be used to for example detect limited dynamic range due to excess stress, particle defects and spring failures, the test may beneficially use very wide range of movement, which may exceed the normal specified dynamic range of the device. Functionality of the entire electro-mechanical system may be also tested by measuring the time required for the system to return to a normal state or to rest position after deflection with the self-test high voltage bias. When a self-test voltage is applied to the rotor mass, the deflection will occur with delay. Measurements of the speed at which the full-scale deflection value is obtained, and/or the speed at which the normal position is attained after the full-scale deflection, offer a way to obtain information about the signal band characteristics of the sensor element. Since speed of operation may be affected by the same factors that affect the full-scale deflection and after-deflection offset, measuring these provide a way to measure speed characteristics of the MEMS sensor device. On the other hand, such speed measurements may even provide more information about the factors that affect the full-scale deflection value. Sensor element pressure related information is available through signal band test. When pressure changes, the frequency band of the MEMS sensor element changes. This further causes a change in settling speed of the MEMS sensor element, which may be detected through self-test response speed.

FIG. 7 illustrates detected movement of a MEMS sensor element under self-test, and measurement of time periods illustrating the characteristics of the MEMS sensor element. In this example, the rotor mass (rotor) is deflected twice with a discrete-time high voltage self-test bias voltage, first "upwards" and then "downwards". This kind of two-direction deflection may be performed by changing the stator electrode in which the high voltage self-test bias is fed. The time of applying the discrete-time self-test voltage is marked with the dotted lines 601a and 601b. The curve (600) illustrates measured signals caused by movement of the rotor mass. The deflection of the rotor mass reaches the respective threshold for deflection (+TH_DEF, −TH_DEF) at a time instances marked with dotted lines 602a, 602b. After deflection, the rotor mass returns to the normal non-deflected state. Return threshold values (+TH_RET, −TH_RET) may be defined, at which the rotor mass is considered to have returned back to normal non-deflected state. These return threshold values (+TH_RET, −TH_RET) may have a slight offset up and down from the actual zero movement state as illustrated. The time required for the rotor mass to reach the respective return threshold value is measured. This time instance is marked with the dotted lines 603a, 603b. Total time for the rotor mass to go through the entire cycle of two subsequent deflections, one in each direction, and return to the normal non-deflected state is marked with T_tot. One or more of these measured time periods may be compared to a number of preset threshold values. One exemplary decision criteria may be that if any of the measured characteristics (i.e. time periods) exceed the respective threshold values, the self-test may be considered failed. Another exemplary decision criteria may be that if a preset number of measured characteristics do not reach their set thresholds, the MEMS sensor fails the self-test. It should be noted, that this type of self-test may be performed for a circuitry with any suitable circuitry generating the needed high voltage bias.

It should be understood, that one or more biasing and readout periods may be required before the deflection of the capacitive element reaches the intended deflection threshold. Similarly, the time period required for the capacitive element to return to normal non-deflected state may last over more than one front end readout and reset periods. The amount of bias/readout or reset/readout cycles required for deflection and return depend for example on the characteristics of the rotor mass and the selected lengths of the corresponding bias/reset/readout cycle periods.

FIG. 8 illustrates stages of an exemplary self-test method that may be applied with capacitive sensor structures according to FIGS. 1 to 7. The process starts in a situation where the capacitive sensor is in normal operation and the front end readout and reset periods of the readout circuit part are running periodically in the capacitive sensor (stage 700). The capacitive sensor is also responsive to detect a trigger signal that enables self-test operation of the capacitive sensor (stage 702). As long as no such trigger signal is detected, the capacitive sensor may stay in normal operation of stage 700. If the trigger signal is detected, the capacitive sensor begins a self-test operation. Typically a capacitive sensor includes several capacitive elements to be tested, and for such situations, the capacitive sensor may be configured to activate an element-specific channel selection control signal SEL_CHx (stage 704) that indicates which one of the capacitive elements is to be tested. If the structure included only one capacitive element, channel selection part of phase 704 could be omitted. Further, when two opposite directions of deflection of the same element is to be tested, a direction parameter DIR may be used. When initiating a test for a new element, this direction parameter is given a value (DIR=0) in phase 704. The direction parameter in this example is a binary parameter. In this example, value DIR=0 indicates that the capacitive element is tested in a first direction of deflection, and value DIR=1 indicates that the capacitive element is tested in a second direction of deflection. In order to create a reference value for the test, measured values (Dstart) at the time before the actuation may be stored (stage 706). After this, the self-test may progress in alternating front end readout periods (READ) and BIAS periods (stage 708). As described earlier, during BIAS periods, the high voltage enable control signal (EN_HV) signal is used to enable high voltage bias generation.

It is known to be very difficult to create a precisely absolute acceleration resembling test signal using high-voltage excitation. Instead, it is more feasible to verify using the repeatable high voltages that the proof-mass moves the required full-scale range in a specified time frame, and that the capacitive sensor returns to the condition prior to the excitation with a specified accuracy and speed after the excitation is removed. For example, it is possible to define a target deflection and stop providing the self-test bias voltage towards the capacitive element right when this deflection is achieved by the capacitive element. The high-voltage bias may be set to be somewhat higher (10-20%) than an estimated voltage for the actual desired deflection, and the decision to stop the self-test may be made immediately when the desired deflection is achieved by disabling the high voltage enable control signal (EN_HV). The time needed to achieve the desired deflection and to return back to the zero deflection may also be used as an indication on the state of the tested capacitive element. This arrangement reduces the need for accurate high voltage levels and thus significantly simplifies the self-test implementation.

Accordingly, in a first sub-test of the self-test of a selected capacitive element, the capability to respond to the actuation may be tested. For this, during the biasing periods (BIAS), generation of the self-test bias voltage HV is triggered (stage 710) for the duration of the high voltage period (EN_HV), and switching arrangements within the capacitive sensor activate the discrete-time high voltage generation circuitry and couples the self-test bias voltage (HV) to a self-test voltage input net of the selected capacitive element (stage 712). This procedure may continue during the bias periods (BIAS) while the high voltage (EN_HV) is enabled, as long as the self-test of the selected capacitive element MEMSx is selected with the channel selection control signal (SEL_CHx).

During the corresponding front end readout periods (READ), deflection of the tested capacitive element is detected (stage 714). The measured data is compared (stage 716) to a defined deflection test end condition to determine whether the first sub-test is to be ended. The end may be triggered, for example, when the measured deflection reaches a defined threshold value, when a predefined actuation test interval is reached or when a predefined actuation test threshold is reached. When the test end condition is reached, the high voltage enable control signal (EN_HV) is disabled by setting it to logical low state, so that no more bias voltage is provided for the capacitive element.

In the end of the first part (Part 1), the result of the first sub-test may be recorded (stage 718). For example, if the first sub-test ends by the measured deflection reaching the defined threshold value, the first sub-test may be considered to be successful (part1 is OK). Correspondingly, if the first sub-test ends by the actuation test interval ending before the measured deflection reaches the defined threshold value, the first sub-test may be considered to indicate failure (part1 is NOK). Alternatively, it is possible to define a target time range during which the defined threshold deflection should be reached, and record the actual time period in which the defined threshold deflection is reached. If the actual time period is not within the target time range, the first sub-test may be considered to indicate failure, for example if the actuation test deflection level is not reached at all or if a preset actuation test threshold is not reached during the set deflection time period.

In the second sub-test of the self-test it is possible to test whether the selected capacitive element returns appropriately back to the initial condition. Accordingly, in the second sub-test of the self-test of the selected capacitive element, the self-test may again progress in alternating biasing periods (BIAS) and readout periods (READ) (stage 720). However, this time the switching arrangements within the capacitive sensor are configured to block the self-test bias voltage (HV) from the selected capacitive element (stage 722). In this example, a zero voltage is coupled to the self-test voltage input net of the capacitive element. This means that there is no electrostatic force to create the deflection and the measured values should approach the initial measured values (Dstart) stored at the time before the actuation.

Accordingly, again during the corresponding front end readout periods (READ), the deflection of the tested capacitive element is detected (stage 724). The measured data is compared (stage 726) to a defined return test end condition to determine whether the second sub-test is to be ended. The end may be triggered, for example, when the measured values reach, within calibrated precision, the initial measured values (Dstart), when a predefined return test interval is reached or when a predefined return test threshold value is reached.

In the end of the second part (Part 2), the result of the second sub-test may be recorded (stage 728). For example, if the second sub-test ends by the measured values corresponding to the initial measured values (Dstart), the second sub-test may be considered to be successful (part2 is OK). Correspondingly, if the second sub-test ends by the return test interval ending before measured values reach the initial measured values (Dstart), the second sub-test may be considered to indicate failure (part2 is NOK). Alternatively, it is possible to define a target time range during which the initial measured values (Dstart) should be reached, and record the actual time period in which the initial measured values (Dstart) is reached. If the actual time period is not within the target time range, the second sub-test may be considered to indicate failure, even if the return test signal target range is not exceeded.

The first part (Part 1) and the second part (Part 2) of the self-test may now be repeated to the same element using the other polarity of the self-test high voltage bias, in other words feeding the self-test bias voltage to another stator of the same element, causing deflection to opposite direction. This is depicted in FIG. 7 when 602a refers the first polarity option while the 602b to the other. After finalizing part 2 of the test in phase 728, polarity of the binary direction value DIR is checked in phase 729. If the polarity matches with the originally set value (DIR=0), the element has only been tested for deflection in one direction. In such case, the binary direction value DIR is inverted in phase 705, and parts 1 and 2 of the test are repeated for the other polarity, restarting the tests from phase 706. Timing parameters may be respectively controlled separately for the first and the other polarities of the high voltage bias.

If the direction value DIR indicates that current element has been self-tested on both directions of deflection (DIR=1), the results of the first sub-test and the second sub-test of the self-test of the selected capacitive element in both deflection directions, the self-test for the current capacitive element (MEMSx) is to be ended. In phase 730 the results of the partial tests are checked, and the total result for the tested capacitive element is recorded. For example, the capacitive element may be considered to pass the test successfully (stage 732), if both the first sub-test and the second sub-test are successful for both directions of deflection. Correspondingly, the capacitive element may be considered to fail the test (stage 734), if either of the first sub-test and the second sub-test fails for either of the directions of deflection. Alternative versions of decision criteria for accepting or rejecting the MEMS element in the self-test may be used instead of the examples above without departing from the scope.

After the self-test of a selected capacitive element (MEMSx), it is checked whether the self-test operation is to end (stage 736). If yes, the sensor returns to normal operation (stage 700). If not, testing of another capacitive element may be started (stage 704) by selecting another channel by enabling another channel selection control signal (SEL_CHx).

It is apparent to a person skilled in the art that as technology advanced, the basic idea of the invention can be implemented in various ways. The invention and its embodiments are therefore not restricted to the above examples, but they may vary within the scope of the claims.

The invention claimed is:

1. A discrete-time high voltage generating circuitry configured to provide a discrete-time high voltage at a high voltage output only during defined high voltage periods, comprising:
a current mirror circuitry configured to receive a supply current from a high voltage source and to provide a slew current;
wherein the discrete-time high voltage generating circuitry is configured to generate the discrete-time high voltage using the slew current,
wherein the high voltage output is configured to be in zero current state during periods different than the defined high voltage periods, and
wherein the discrete-high voltage generating circuitry further comprises a high voltage control circuitry comprising a voltage division network comprising two capacitors connected in series, wherein the voltage division network is configured to receive part of the slew current, and wherein the voltage division network is configured to essentially maintain the generated high voltage value during the defined high voltage periods after generation of the high voltage.

2. The discrete-time high voltage generating circuitry according to claim 1,
wherein the high voltage control circuitry further comprises:
a comparator configured to compare a voltage level between the two capacitors of the voltage division network to a preset reference voltage and, in response to the comparing, provide in its output a logical signal for controlling provision of the slew current.

3. The discrete-time high voltage generating circuitry of claim 1, wherein the current mirror circuitry is configured to provide the slew current for generating the discrete-time high voltage during at least part of duration of the defined high voltage periods.

4. The discrete-time high voltage generating circuitry of claim 1, configured to essentially maintain a generated high voltage value at the high voltage output when the current mirror circuitry is set to output a zero current during the defined high voltage periods.

5. The discrete-time high voltage generating circuitry of claim 4, wherein the discrete-time high voltage generating circuitry is configured to cause a capacitive load circuitry coupled to the high voltage output to be charged into the high voltage value during the defined high voltage period; and
the capacitive load circuitry is configured to maintain the high voltage value during a reminder of the defined high voltage period when the current mirror circuitry is inactivated.

6. The discrete-time high voltage generating circuitry of claim 1, wherein the high voltage control circuitry further comprises at least one reset switch configured to cause resetting voltages over the capacitors of the voltage division network to essentially zero voltage prior to enabling discrete-time high voltage generation and after disabling discrete-time high voltage generation.

7. The discrete-time high voltage generating circuitry of claim 1, wherein a current mirror control transistor is configured to control a reference current from the high voltage source towards the current mirror circuitry, and wherein the current mirror circuitry is configured to be activated by providing a logical high value at a gate of the current mirror control transistor.

8. The discrete-time high voltage generating circuitry of claim 7, further comprising at least one logic circuitry configured to receive in its inputs a channel selection signal and the logical signal from the comparator, wherein output of the logic circuitry is coupled to the gate of the current mirror control transistor and is configured to control operation of the current mirror control transistor, and the logic circuitry is configured to provide a logical high value at its output when both the channel selection signal and the logical signal provided by the comparator have logical high values.

9. The discrete-time high voltage generating circuitry of claim 1, wherein the circuitry further comprises at least one isolating switching stage configured to further isolate both the high voltage control circuitry and the high voltage output from the current mirror circuitry for periods different than the defined high voltage periods.

10. The discrete-time high voltage generating circuitry of claim 9, wherein part of the slew current, received in the at least one isolating switching stage from the current mirror circuitry when the current mirror circuitry is activated during defined high voltage periods, is further configured to cause a diode to generate a gate bias voltage configured to close isolating switches of the isolating switching stage, causing the isolating switching stage to couple the current mirror circuitry to the high voltage control circuitry and to the high voltage output.

11. The discrete-time high voltage generating circuitry of claim 1, wherein the circuitry comprises the high voltage control circuitry configured to be temporally shared for controlling generation of discrete-time high voltages for biasing more than one capacitive MEMS elements, wherein the temporal sharing is configured to be implemented with circuitry comprising more than one sets of circuitry, each of said more than one sets of circuitry comprising the current mirror circuitry, wherein each of said more than one sets of circuitry is configured to control generation of a discrete-time high voltage to one of the more than one capacitive MEMS elements during different defined high voltage periods.

12. A method to operate a discrete-time high voltage generating circuitry configured to provide a discrete-time high voltage at a high voltage output only during defined high voltage periods, the method comprising:

receiving a supply current from a high voltage source by a current mirror circuitry, and providing a slew current from the at least one current mirror circuitry;

generating the discrete-time high voltage using the slew current; and setting the high voltage output in zero current state during periods different than the defined high voltage periods;

controlling generation of the discrete-time high voltage in a high voltage control circuitry, wherein the controlling comprises:

receiving at least part of the slew current in a voltage division network comprising two capacitors connected in series, and essentially maintaining the generated high voltage value in the voltage division network during said defined high voltage period after generation of the high voltage.

13. The method according to claim 12, wherein said controlling generation of the discrete-time high voltage in the high voltage control circuitry further comprises:

comparing a voltage level between the two capacitors of the voltage division network to a preset reference voltage; and in response to the comparing, providing a logical signal for controlling the provision of the slew current.

14. The method according to claim 13, further comprising resetting voltages over capacitors of the voltage division network to essentially zero voltage prior to enabling discrete-time high voltage generation and after disabling discrete-time high voltage generation.

15. The method according to claim 12, comprising providing the slew current from the at least one current mirror circuitry for generating the discrete-time high voltage during at least part of duration of the defined high voltage periods.

16. The method according to claim 12, further comprising maintaining a generated high voltage value in the high voltage output when the current mirror circuitry is set to output a zero current during the defined high voltage periods.

17. The method to operate a discrete-time high voltage generating circuitry of claim 16, comprising:

causing a capacitive load circuitry coupled to the high voltage output to be charged into the high voltage value during a defined high voltage period; and maintaining the high voltage value in the capacitive load circuitry during the defined high voltage period when the current mirror circuitry is inactivated.

18. The method according to claim 12, further comprising controlling a reference current from the high voltage source towards the current mirror circuitry with a current mirror control transistor, wherein the current mirror circuitry is configured to be activated by providing a logical high value at a gate of the current mirror transistor.

19. The method according to claim 18, further comprising receiving in inputs of a logic circuitry a channel selection signal and the logical signal, providing a logical value at the output of the logical circuitry and controlling the current mirror control transistor with the logical value provided at the output of the logic circuitry, wherein the method comprises providing a logical high value at the output of the logic circuitry when both the channel selection signal and the logical signal are in logical high state.

20. The method according to claim 12 wherein further comprising isolating, with an isolating switching arrangement, the current mirror circuitry from the high voltage control circuitry and from the high voltage output for periods different than the defined high voltage periods.

21. The method to operate a discrete-time high voltage generating circuitry according to claim 20, further comprising causing a gate bias voltage to be generated over a diode in the isolating switching arrangement by part of the slew current received from the current mirror circuitry, wherein the gate bias voltage over the diode is configured to close isolating switches of the switching stage when the current mirror circuitry is activated during the defined high voltage periods, causing the isolating switching stage to couple the current mirror circuitry to the high voltage control circuitry and to the high voltage output.

22. The method to operate a discrete-time high voltage generating circuitry according to claim 12, wherein the method comprises temporally sharing the high voltage control circuitry for controlling generation of at least one discrete-time high voltage for providing discrete-time high voltage bias voltages to more than one capacitive MEMS elements, wherein the temporal sharing comprises using more than one sets of circuitries, each of said more than one sets of circuitry comprising the current mirror circuitry, each one of said more than one sets of circuitry configured to generate a discrete-time high voltage to the respective one of the more than one capacitive MEMS elements.

* * * * *